United States Patent
Ma

(10) Patent No.: US 9,478,565 B2
(45) Date of Patent: Oct. 25, 2016

(54) ARRAY SUBSTRATE AND METHOD FOR FABRICATING THE SAME, AND DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventor: Yu Ma, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/570,095

(22) Filed: Dec. 15, 2014

(65) Prior Publication Data

US 2016/0056178 A1    Feb. 25, 2016

(30) Foreign Application Priority Data

Aug. 22, 2014  (CN) .......................... 2014 1 0419140

(51) Int. Cl.
 *H01L 27/12*    (2006.01)

(52) U.S. Cl.
 CPC ......... *H01L 27/124* (2013.01); *H01L 27/1262* (2013.01)

(58) Field of Classification Search
 CPC ........................... H01L 27/1214; H01L 27/12
 USPC ............................................ 257/72; 438/637
 See application file for complete search history.

(56) References Cited

U.S. PATENT DOCUMENTS

| | | | | |
|---|---|---|---|---|
| 4,959,704 A | * | 9/1990 | Isomura ................ | H01L 23/057 257/208 |
| 5,060,191 A | * | 10/1991 | Nagasaki ................ | G11C 11/22 365/109 |
| 5,200,663 A | * | 4/1993 | Mochizuki ........... | H03H 9/1455 310/313 D |
| 2004/0021786 A1 | * | 2/2004 | Nakamura ........... | G06K 9/0004 348/294 |
| 2011/0222001 A1 | * | 9/2011 | Umezawa ............... | H01L 27/12 349/84 |
| 2015/0255773 A1 | * | 9/2015 | Yoshinari .................. | A45F 3/04 429/7 |

FOREIGN PATENT DOCUMENTS

| | | |
|---|---|---|
| CN | 1309320 A | 8/2001 |
| CN | 1469696 A | 1/2004 |
| CN | 1982951 A | 6/2007 |
| JP | 2004213020 A | 7/2004 |

OTHER PUBLICATIONS

Notification of the First Office Action dated Jun. 28, 2016 corresponding to Chinese application No. 201410419140.2.

* cited by examiner

*Primary Examiner* — Jami M Valentine
(74) *Attorney, Agent, or Firm* — Nath, Goldberg & Meyer; Joshua B. Goldberg

(57) ABSTRACT

The embodiments of the present invention provide an array substrate, a method for fabricating the array substrate and a display panel. The array substrate comprises a first region and a second region adjoining the first region, a plurality of signal lines are provided in the first region, and a plurality of lead wires connected with the plurality of signal lines are provided in the second region, the array substrate comprises at least one conductive member, each conductive member is connected in parallel with one lead wire, and an overall resistance of the conductive member and the lead wire connected in parallel with the conductive member is smaller than a resistance of the lead wire connected in parallel with the conductive member.

18 Claims, 1 Drawing Sheet

ARRAY SUBSTRATE AND METHOD FOR FABRICATING THE SAME, AND DISPLAY PANEL

CROSS-REFERENCE TO RELATED APPLICATION

This application claims priority under 35 U.S.C. §119 to Chinese Patent Application No. 201410419140.2, filed on Aug. 22, 2014, in the Chinese Intellectual Property Office, the disclosure of which is incorporated by reference herein in its entirety.

FIELD OF THE INVENTION

The present invention relates to the field of liquid crystal display device, and more particularly, to an array substrate, a method for fabricating the array substrate and a display panel comprising the array substrate.

BACKGROUND OF THE INVENTION

An array substrate of a liquid crystal display panel comprises a display region and a signal input region provided at sides of the display region, signal lines are provided in the display region, and lead wires connected to the signal lines are provided in the signal input region. Here, the signal line may be a gate line, a common electrode line or a data line. Accordingly, the lead wire may be a gate line lead wire, a common electrode line lead wire or a data line lead wire. A signal is supplied to the signal line via the corresponding lead wire.

However, existing display panels generally suffer the problem of undesirable display effect. In addition, the display panel increasingly tends to have a narrow border. The inventor of the present invention finds out that, although a display panel with a narrow border may display wider pictures, quality of displayed pictures (e.g., definition) fails to reach a desired effect. That is, the defect of undesirable quality of displayed images becomes more significant for the display panel with a narrow border.

Therefore, how to improve the quality of pictures displayed by the display panel becomes a technical problem to be solved in the art.

SUMMARY OF THE INVENTION

An objective of the present invention is to provide an array substrate, a method for fabricating the array substrate and a display device comprising the array substrate, the array substrate has a good signal driving effect, and the display panel comprising the array substrate has a good display effect.

In order to achieve the above objective, as an aspect of the present invention, there is provided an array substrate, comprising: a first region and a second region adjoining the first region, a plurality of signal lines being provided in the first region, and a plurality of lead wires connected with the plurality of signal lines being provided in the second region, wherein, the array substrate comprises at least one conductive member, each conductive member is connected in parallel with one lead wire, and an overall resistance of the conductive member and the lead wire connected in parallel with the conductive member is smaller than a resistance of the lead wire connected in parallel with the conductive member.

Among the plurality of lead wires, the longest lead wires having a number equal to the number of the at least one conductive member may be connected in parallel with the at least one conductive member, respectively.

Transparent electrodes may be provided in the first region, each conductive member comprises a transparent conductive member made of the same material as the transparent electrode and provided on the same layer as the transparent electrode, an insulation layer is provided between a layer comprising the transparent electrode and the transparent conductive member and a layer comprising the lead wires, and each transparent conductive member is connected with the lead wire through at least one via penetrating through the insulation layer, so that the transparent conductive member is connected in parallel with the lead wire.

The transparent electrodes may comprise first transparent electrodes provided above the signal lines and second transparent electrodes provided below the signal lines, each transparent conductive member may comprise a first transparent conductive member provided above the lead wire and/or a second transparent conductive member provided below the lead wire, the first transparent conductive member is made of the same material as the first transparent electrodes and provided in the same layer as the first transparent electrodes, and the second transparent conductive member is made of the same material as the second transparent electrodes and provided on the same layer as the second transparent electrodes, and the via comprises a first via connecting the first transparent conductive member and the lead wire and a second via connecting the second transparent conductive member and the lead wire.

When the conductive member comprises the first transparent conductive member, the conductive member may further comprise a conductive adhesive part provided on and electrically connected with the first transparent conductive member.

The signal lines may comprise common electrode lines, gate lines and/or data lines.

In some embodiments, the signal lines comprises common electrode lines, gate lines and data lines, the lead wires comprises common electrode line lead wires, gate line lead wires and data line lead wires, the at least one conductive member comprises at least one common electrode line lead wire conductive member, at least one gate line lead wire conductive member and at least one data line lead wire conductive member, the common electrode line lead wire conductive member comprises a metal common electrode line lead wire conductive member connected in parallel with the common electrode line lead wire through a third via, the gate line lead wire conductive member comprises a metal gate line lead wire conductive member connected in parallel with the gate line lead wire through a fourth via, and the data line lead wire conductive member comprises a metal data line lead wire conductive member connected in parallel with the data line lead wire through a fifth via, the metal common electrode line lead wire conductive member, the metal gate line lead wire conductive member and the data lines are made of the same material and provided in the same layer, the metal data line lead wire conductive member and the gate lines are made of the same material and provided in the same layer.

The conductive member may be made of conductive adhesive.

As another aspect of the present invention, there is provided a display panel, comprising the above array substrate.

As yet another aspect of the present invention, there is provided a method for fabricating an array substrate, the array substrate comprises a first region and a second region adjoining the first region, the method comprises steps of: forming a pattern comprising signal lines and lead wires, the signal lines being provided in the first region, the lead wires being provided in the second region, and the signal lines being connected with the lead wires; and forming a pattern comprising at least one conductive member, each conductive member being connected in parallel with one lead wire, and an overall resistance of the conductive member and the lead wire connected in parallel with the conductive member being smaller than a resistance of the lead wire connected in parallel with the conductive member.

The number of the at least one conductive member may be equal to that of the lead wires.

Between the step of forming the pattern comprising the signal lines and the lead wires and the step of forming the pattern comprising the at least one conductive member, the method further comprises steps of: forming an insulation layer; and forming at least one first via penetrating through the insulation layer in the insulation layer, the first via being provided on the lead wire, and the conductive member being connected in parallel with the lead wire through the first via.

The array substrate may comprise first transparent electrodes provided above the signal lines, the conductive member may comprise a first transparent conductive member, and the step of forming the pattern comprising the at least one conductive member comprises steps of: forming a first transparent electrode material layer on the insulation layer, wherein the transparent electrode material forming the first transparent electrode material layer fills the at least one first via; and forming a pattern comprising the first transparent electrodes and the at least one first transparent conductive member, the first transparent conductive member being electrically connected with the lead wire through the first via.

The step of forming the pattern comprising the at least one conductive member may further comprise a step of: providing a conductive adhesive part on each first transparent conductive member, so that the first transparent conductive member and the conductive adhesive part together constitute at least a portion of the conductive member.

The array substrate may further comprise second transparent electrodes provided below the signal lines, before the step of forming the pattern comprising the signal lines and the lead wires, the method further comprises steps of: forming a second transparent electrode material layer; forming a pattern comprising the second transparent electrodes and at least one second transparent conductive member, the at least one second transparent conductive member being provided in the second region; forming an insulation layer, the insulation layer covering the second transparent electrodes and the at least one second transparent conductive member; and forming at least one second via penetrating through the insulation layer, the second via being provided on the second transparent conductive member, and the method of forming the pattern comprising the signal lines and the lead wires comprises steps of: forming a metal layer, wherein material forming the metal layer fills the at least one second via; and performing a patterning process on the metal layer to form the pattern comprising the signal lines and the lead wires, the lead wire being electrically connected with the second transparent conductive member through the second via.

The signal lines may comprise common electrode lines, gate lines and/or data lines.

The step of forming the pattern comprising the signal lines and the lead wires may comprise steps of: forming a pattern comprising the common electrode lines, common electrode line lead wires, the gate lines and gate line lead wires; forming a spacer layer; and forming a pattern comprising the data lines and data line lead wires.

The at least one conductive member may comprise at least one common electrode line lead wire conductive member, at least one gate line lead wire conductive member and at least one data line lead wire conductive member, the common electrode line lead wire conductive member comprises a metal common electrode line lead wire conductive member, the gate line lead wire conductive member comprises a metal gate line lead wire conductive member, and the data line lead wire conductive member comprises a metal data line lead wire conductive member, the step of forming the pattern comprising the at least one conductive member comprises steps of: forming a pattern comprising the at least one metal data line lead wire conductive member; and forming at least one third via, at least one fourth via and at least one fifth via penetrating through the spacer layer after the step of forming the spacer layer and before the step of forming the pattern comprising the data lines and the data line lead wires, the third via being provided on the common electrode line lead wire, the fourth via being provided on the gate line lead wire, and the fifth via being provided under the data line lead wire.

The step of forming the pattern comprising the at least one metal common electrode line lead wire conductive member and the at least one metal gate line lead wire conductive member and the step of forming the pattern comprising the data line and the data line lead wires may be performed synchronously, the step of forming the pattern comprising the at least one metal data line lead wire conductive member and the step of forming the pattern comprising the common electrode lines, the common electrode lead wires, the gate lines and the gate line lead wires may be performed synchronously.

In the method, the conductive member may be made of conductive adhesive.

In the array substrate according to the embodiments of the present invention, the conductive member electrically connected with the lead wire is provided above or below the lead wire, which corresponds to that the conductive member and the lead wire are connected in parallel, the resistance of the combination member formed by the lead wire and the conductive member is smaller than that of the lead wire itself. When a signal is supplied to the array substrate, the signal passes through the combination member consisting of the conductive member and the lead wire. The resistance of the combination member consisting of the conductive member and the lead wire is relatively small, and with such technical solution, resistance of a lead wire in a lead wire region may be adjusted, so as to improve uniformity of the signals on the signal lines, so that the array substrate has good signal driving effect. When the array substrate is applied to a display panel, driving effect of display signals, uniformity of display of signals and picture quality of displayed pictures may be improved. In addition, the array substrate according to the embodiments of the present invention may be fabricated by a method that is simple and has a low cost.

BRIEF DESCRIPTION OF THE DRAWINGS

The accompanying drawings which constitute a part of the description are used for providing further understanding of the present invention and for explaining the present invention in conjunction with the following specific embodiments, rather than limiting the present invention. In the accompanying drawings.

DESCRIPTION OF THE PREFERRED EMBODIMENT

Hereinafter, the specific embodiments of the present invention will be described in detail with reference to the accompanying drawings. It should be understood that the specific embodiments described herein are only intended to illustrate and explain the present invention, but not to limit the present invention.

It should be understood that, terms of orientations such as "on", "above", "under" and "below" used herein refer to orientations of "on", "above", "under" and "below" shown in FIG. 2.

An array substrate according to the embodiments of the present invention comprises various types of substrates in which electronic elements are arranged in an array, and signal lines for driving the electronic elements are provided in the substrate. The substrate may be a display substrate such as thin film transistor liquid crystal display array substrate or electroluminescent display substrate, or may be other type of substrate such as x-ray inspection substrate or solar cell substrate. The following embodiments will be described by taking display substrate as an example. However, the described array substrate and display panel are not intended to limit the protection scope of the present invention.

Figure 1:
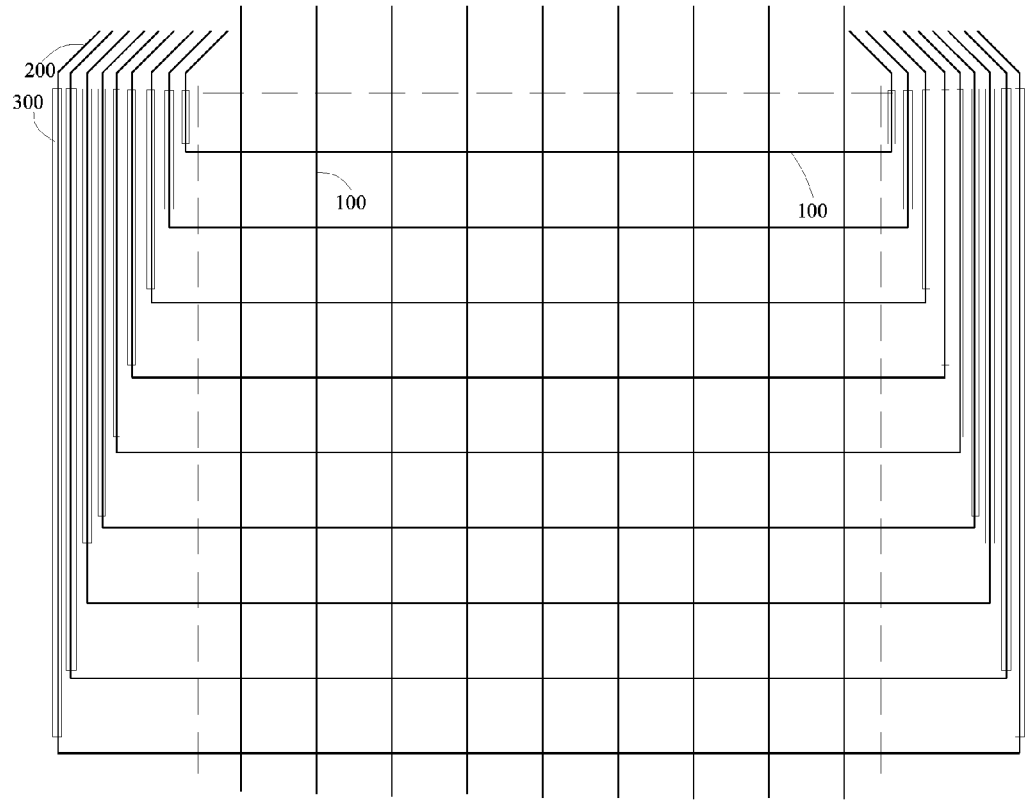
FIG. 1 is a schematic diagram of positional relationship among signal lines, lead wires and conductive members in an array substrate according to an embodiment of the present invention.

As shown in FIG. 1, the embodiment of the present invention provides an array substrate, comprising a first region (i.e., a display region) and a second region (i.e. a signal input region) adjoining the first region. In FIG. 1, a region between two vertical dotted lines and below a horizontal dotted line is the first region, and regions on the left of the left vertical dotted line, on the right of the right vertical dotted line and above the horizontal dotted line are the second region.

As shown in FIG. 1, a plurality of signal lines 100 are provided in the first region, and a plurality of lead wires 200 connected to the plurality of signal lines 100 are provided in the second region. As shown in FIGS. 1 and 2, the array substrate further comprises at least one conductive member 300, each conductive member 300 is connected in parallel with one lead wire 200, and an overall resistance of the conductive member 300 and the lead wire 200 connected in parallel with the conductive member 300 is smaller than the resistance of the lead wire 200 connected in parallel with the conductive member 300. It can be understood that the conductive member 300 may be provided in the second region.

In the array substrate according to the embodiments of the present invention, the conductive member 300 connected in parallel with the lead wire 200 is provided, when a signal is input to the array substrate, the signal passes through a combination member consisting of the conductive member 300 and the lead wire 200. The overall resistance of the lead wire 200 and the conductive member 300 which are connected in parallel is smaller than the resistance of the lead wire 200 itself. Therefore, a loss of the signal voltage when the signal passes through the combination member formed by the lead wire 200 and the conductive member 300 connected in parallel is less than that of the signal voltage when the signal passes through only the lead wire 200. It can thus be seen that, the conductive member 300 connected in parallel with the lead wire 200 may be provided to adjust the resistance of the lead wire in a lead wire region (i.e., the second region), so as to improve uniformity of the signals on the signal lines, so that the array substrate has a good signal driving effect. When the array substrate is applied to a display panel, driving effect of display signals, uniformity of display of signals and picture quality of displayed pictures may be improved. In the embodiments of the present invention, "connected in parallel" means that the conductive member and the lead wire are provided in different layers and are electrically connected.

In the embodiments of the present invention, the number of the conductive members 300 is not specifically limited, for example, for each lead wire 200, a conductive member 300 may be provided in parallel, or only for relatively thin lead wires 200, the conductive members 300 may be provided in parallel or only for lead wires at specific positions, the conductive members 300 may be provided in parallel, for example, only for relatively long lead wires among the plurality of the lead wires 200, the conductive members 300 are provided in parallel. In an embodiment, for any number of longest lead wires among the plurality of lead wires, the conductive members are provided in parallel. Here, the number may be 1, i.e., the longest one, or may be N−1 (N is the number of the plurality of lead wires), i.e., all lead wires except the shortest one.

It can be understood that, when the array substrate comprises only one conductive member, the conductive member is connected in parallel with a predetermined lead wire. In this case, the shape and area of the conductive member are not limited, the conductive member may be a relatively wide line, or may be a pattern with any other shape. When the array substrate comprises a plurality of conductive members, each conductive member is connected in parallel with only one lead wire. In this case, the plurality of conductive members are not electrically connected with each other, and the conductive members may be formed by any patterning process.

In the embodiments of the present invention, there is no special requirement on the structure of the conductive member 300, as long as the conductive member 300 is provided in parallel with the lead wire 200, and the overall resistance of the combination member of the conductive member 300 and the lead wire 200 is smaller than the resistance of the lead wire 200 itself.

Figure 2:
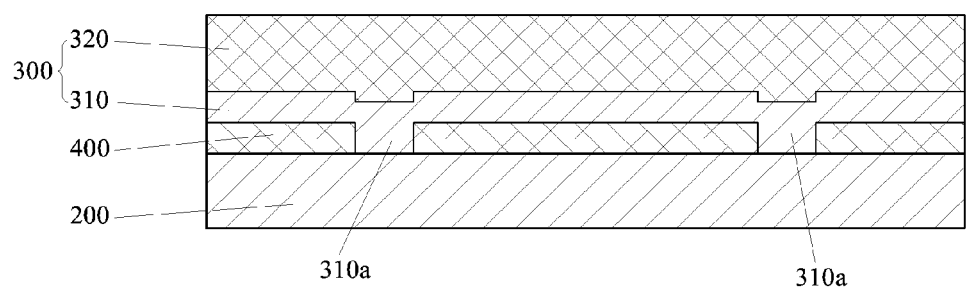
FIG. 2 is a partial cross-sectional view of a second region in an array substrate according to an embodiment of the present invention.

In order not to increase the width of the second region, the conductive member 300 is provided above (as shown in FIG. 2) or below the lead wire 200. The conductive member 300 may be provided in parallel directly on or under the lead wire 200. For example, the conductive member 300 may be formed before forming the lead wire 200, and then the lead wire 200 is formed on the conductive member 300. Alternatively, the conductive member 300 may be formed directly on the lead wire 200 after the lead wire 200 is formed.

In an embodiment, thin film transistors and transparent conductive film layer patterns serving as pixel electrodes may be provided in the first region. Hereinafter, the patterns are referred to as transparent electrodes.

In order to reduce the thickness of the array substrate, for example, the conductive member 300 comprises a transparent conductive member made of the same material as the transparent electrode and provided on the same layer as the transparent electrode, an insulation layer 400 is provided between a layer comprising the transparent electrode and the transparent conductive member and a layer comprising the lead wire 200, and each transparent conductive member is connected in parallel with the lead wire 200 through at least one via penetrating through the insulation layer 400.

Here, "made of the same material and provided in the same layer" refers to that the at least one transparent conductive member and the transparent electrodes are formed by a same patterning process. Specifically, a layer of transparent electrode material may be first deposited, and the transparent electrodes and the at least one transparent conductive member may be formed by a patterning process using the layer of transparent electrode material. It can be understood that, the transparent electrodes may be formed in the first region, while the at least one transparent conductive member may be formed in the second region.

There is no special requirement on the number of the via corresponding to each transparent conductive member. For example, each transparent conductive member is connected in parallel with the corresponding lead wire 200 through one via. In order to reduce the overall resistance of the combination member consisting of the transparent conductive member, the via and the corresponding lead wire 200, for example, each transparent conductive member is connected in parallel with the lead wire 200 through a plurality of vias. In the embodiment shown in FIG. 2, each transparent conductive member is connected in parallel with the lead wire 200 through two vias. In addition, an advantage of providing the plurality of vias is that, reliability of electrical connection between the transparent conductive member and the lead wire 200 can be improved.

In the embodiments of the present invention, in addition to connection through the via, the transparent conductive member and the lead wire 200 may be in direct contact by omitting all material provided therebetween.

In the embodiments of the present invention, the transparent electrodes may be provided above the lead wires 200, or may be provided below the lead wires 200, for example, FIG. 2 illustrates a case where the transparent electrodes are provided above the lead wires 200.

The transparent electrodes may comprise first transparent electrodes provided above the signal lines and second transparent electrodes provided below the signal lines, the first transparent electrode is one of a pixel electrode and a common electrode, and the second transparent electrode is the other of the pixel electrode and the common electrode. Accordingly, the transparent conductive member may comprise a first transparent conductive member 310 provided above the lead wire 200 and/or a second transparent conductive member (not illustrated in the drawings) provided below the lead wire. The first transparent conductive member 310 may be made of the same material as the first transparent electrodes and formed synchronously with the first transparent electrodes, and the second transparent conductive member may be made of the same material as the second transparent electrodes and formed synchronously with the second transparent electrodes. The first transparent conductive member 310 is electrically connected to the lead wire 200 through a first via 310a, and the second transparent conductive member is electrically connected to the lead wire through a second via.

When the conductive member comprises the first transparent conductive member 310, in order to obtain the conductive member 300 with a predetermined resistance, for example, the conductive member 300 may further comprise a conductive adhesive part 320 provided on and electrically connected with the first transparent conductive member 310.

For example, in the embodiments of the present invention, conductive balls are provided in the conductive adhesive part 320, and the resistance of the conductive adhesive part 320 may be adjusted by adjusting concentration of the conductive balls, thereby adjusting the resistance of the conductive member 300.

Of course, in the embodiments of the present invention, the conductive member 300 may be completely made of conductive adhesive.

The signal lines 100 may comprise common electrode lines, gate lines and/or data lines. The conductive member is provided in parallel with the lead wire connected to a common electrode line, so that a common electrode signal supplied to the common electrode can become more uniform, and the loss of the common electrode signal during transmission can be reduced. The conductive member is provided in parallel with the lead wire connected to a gate line, so that a scanning signal supplied to the gate line can become more uniform, and the loss of the scanning signal during transmission can be reduced. The conductive member is provided in parallel with the lead wire connected to a data line, so that a gray-scale signal supplied to the data line can become more uniform, and the loss of the gray-scale signal during transmission can be reduced.

As described above, the signal lines comprises the common electrode lines, the gate lines and the data lines, and the lead wires comprises common electrode line lead wires, gate line lead wires and data line lead wires. In this case, the conductive members comprises common electrode line lead wire conductive members, gate line lead wire conductive members and data line lead wire conductive members. Each common electrode line lead wire conductive member comprises a metal common electrode line lead wire conductive member connected in parallel with the common electrode line lead wire through a third via. Each gate line lead wire conductive member comprises a metal gate line lead wire conductive member connected in parallel with the gate line lead wire through a fourth via. The metal common electrode line lead wire conductive member, the metal gate line lead wire conductive member and the data lines are made of the same material and provided in the same layer. In addition, each data line lead wire conductive member comprises a metal data line lead wire conductive member connected in parallel with the data line lead wire through a fifth via. The metal data line lead wire conductive member and the gate lines are made of the same material and provided in the same layer.

In addition to the metal common electrode line lead wire conductive member, each common electrode line lead wire conductive member may further comprise a transparent common electrode line lead wire conductive member. In addition to the metal gate line lead wire conductive member, each gate line lead wire conductive member may further comprise a transparent gate line lead wire conductive member. The transparent common electrode line lead wire conductive member may be a portion of the first or second transparent conductive member. The transparent gate line lead wire conductive member may be a portion of the first or second transparent conductive member. In addition to the metal data line lead wire conductive member, each data line lead wire conductive member may further comprise a transparent data line lead wire conductive member, and the transparent data line lead wire conductive member may be a portion of the first or second transparent conductive member.

As another aspect of the present invention, there is provided a display panel comprising the above array substrate according to the embodiments of the present invention.

Further, the display panel further comprises an opposite substrate provided opposite to the array substrate.

As described above, in the array substrate according to the embodiments of the present invention, the conductive member electrically connected with the lead wire is provided above or below the lead wire, which corresponds to that the conductive member and the lead wire are connected in parallel. The resistance of the conductive member is smaller than that of the lead wire, thus the resistance of the combination member formed by the lead wire and the conductive member is smaller than that of the lead wire itself. When a signal is supplied to the array substrate, the signal passes through the combination member consisting of the conductive member and the lead wire. As described above, the resistance of the combination member consisting of the conductive member and the lead wire is relatively small, and therefore, the signal on the signal line is uniform, thus the picture quality of the displayed pictures can be improved.

The display panel may further comprise a sealant connecting the array substrate and the opposite substrate. The conductive adhesive of the conductive member may be provided inside the sealant.

The display panel according to the embodiments of the present invention may be applied to various types of display devices such as TV, cell phone, computer display, tablet PC, etc.

As yet another aspect of the present invention, there is provided a method for fabricating an array substrate, the array substrate comprises a first region and a second region adjoining the first region, as described above, the method comprises steps of: forming a pattern comprising signal lines and lead wires, the signal lines being provided in the first region, the lead wires being provided in the second region, and the signal lines being connected with the lead wires; and forming a pattern comprising at least one conductive member, each conductive member being connected in parallel with one lead wire, and an overall resistance of the conductive member and the lead wire connected in parallel with the conductive member is smaller than a resistance of the lead wire connected in parallel with the conductive member.

In the embodiments of the present invention, the specific process method for forming the signal lines and the lead wires is not limited. For example, the pattern comprising the signal lines and the lead wires may be obtained by any one of printing, transferring and conventional photolithographic process. It can be seen from the above description that, the number of the conductive member may be equal to or different from that of the lead wires. In order to reduce the loss of signals during transmission, for example, the number of the conductive member is equal to that of the lead wires, i.e., each lead wire corresponds to one conductive member.

In the embodiments of the present invention, the sequence in which the above steps are performed is not limited, the sequence of the above steps may be determined according to the specific location and structure of the conductive member.

For example, when the at least one conductive member is provided below the lead wires, the step of forming the pattern comprising the at least one conductive member may be first performed, and then the step of forming the pattern comprising the signal lines and the lead wires is performed.

When the at least one conductive member is provided above the lead wires, the step of forming the pattern comprising the signal lines and the lead wires may be first performed, and then the step of forming the pattern comprising the at least one conductive member is performed.

As described above, the array substrate may comprise the first transparent electrodes provided above the signal lines and the second transparent electrodes provided below the signal lines.

Between the step of forming the pattern comprising the signal lines and the lead wires and the step of forming the pattern comprising the at least one conductive member, the method comprises steps of: forming an insulation layer; and forming, in the insulation layer, a first via penetrating through the insulation layer, the first via being provided on the lead wire.

Subsequently, the step of forming the pattern comprising the at least one conductive member comprises steps of: forming a first transparent electrode material layer on the insulation layer, wherein the transparent electrode material forming the first transparent electrode material layer fills the first via; and forming a pattern comprising first transparent electrodes and at least one first transparent conductive member, the first transparent conductive member being electrically connected with the lead wire through the first via.

In the above method, the first transparent electrodes and the at least one first transparent conductive member may be formed by a same patterning process, and thus the method is simplified.

The transparent electrode material layer may be deposited by sputtering or evaporating process. Here, the transparent electrode material may be ITO. The pattern comprising the transparent electrodes and the at least one transparent conductive member may be formed by conventional photolithographic patterning process. Specifically, a layer of photoresist may be first coated on the transparent electrode material layer, and the photoresist is exposed and developed by using a mask, and then a dry etching or a wet etching is performed on the transparent electrode material by using the exposed and developed photoresist as a mask, so as to form the pattern comprising the transparent electrodes and the at least one transparent conductive member.

Here, the insulation layer may be made of silicon oxide or silicon nitride, and the insulation layer may be formed by sputtering or evaporating process. The first via may be formed by dry etching or wet etching. Specifically, a layer of photoresist may be coated on the insulation layer, and the photoresist is exposed and developed, and then the insulation layer is etched by using the exposed and developed photoresist as a mask, so as to form the first via.

In depositing the first transparent electrode material layer, the transparent electrode material fills the first via, so that the finally formed first transparent conductive member can be electrically connected with the lead wire.

As described above, in order to adjust the resistance of the conductive member, in addition to the transparent conductive member, each conductive member further comprises conductive adhesive, for example.

In the embodiments in which the conductive member further comprises the conductive adhesive and the at least one conductive member is provided above the lead wires, the step of forming the pattern comprising the at least one conductive member further comprises a step of: providing the conductive adhesive on each first transparent conductive member, the first transparent conductive member and the conductive adhesive together constituting the conductive member.

In the embodiments of the present invention, the conductive adhesive may be provided on the transparent conductive member in various ways. For example, the conductive adhesive may be provided on the transparent conductive member by transferring. Alternatively, a layer of conductive adhesive layer may be first coated on the layer comprising the transparent electrodes and the at least one transparent conductive member, and then the conductive adhesive provided on each transparent conductive member is formed by a patterning process.

As described above, the array substrate further comprises the second transparent electrodes provided below the signal lines. In this case, before the step of forming the pattern comprising the signal lines and the lead wires, the method further comprises: forming a second transparent electrode material layer; forming a pattern comprising second transparent electrodes and at least one second transparent conductive member, the at least one second transparent conductive member being provided in the second region, and the second transparent electrodes being provided in the first region.

After the step of forming the pattern comprising the second transparent electrodes and the at least one second transparent conductive member, the method comprises steps of: forming an insulation layer, the insulation layer covering the second transparent electrodes and the at least one second transparent conductive member; and forming at least one second via penetrating through the insulation layer, the second via being provided on the second transparent conductive member.

Subsequently, the method of forming the pattern comprising the signal lines and the lead wires comprises steps of: forming a metal layer, wherein material forming the metal layer fills the at least one second via; and performing a patterning process on the metal layer to form the pattern comprising the signal lines and the lead wires.

Here, the transparent electrode material layer may be deposited by sputtering or evaporating process. The transparent electrode material of the second transparent electrode material layer may be ITO.

Since the first transparent conductive member and/or the second transparent conductive member and the transparent electrode are synchronously formed, compared to an array substrate that does not comprise the first transparent conductive member and/or the second transparent conductive member, no additional step is required in the method for fabricating the array substrate according to the embodiments of the present invention. That is, the method for fabricating the array substrate according to the embodiments of the present invention is simple, and has a low cost.

As described above, the signal lines comprise the common electrode lines, the gate lines and/or the data lines. The transparent electrodes may be the pixel electrodes or the common electrode.

When the signal lines comprise the common electrode lines, the gate lines and the data lines, and the lead wires comprises the common electrode line lead wires, the gate line lead wires and the data line lead wires, the step of forming the pattern comprising the signal lines and the lead wires comprises steps of: forming a pattern comprising common electrode lines, common electrode line lead wires, gate lines and gate line lead wires; forming a spacer layer; and forming a pattern comprising data lines and data line lead wires.

The conductive member comprises the common electrode line lead wire conductive member, the gate line lead wire conductive member and the data line lead wire conductive member. The common electrode line lead wire conductive member comprises the metal common electrode line lead wire conductive member, the gate line lead wire conductive member comprises the metal gate line lead wire conductive member, and the data line lead wire conductive member comprises the metal data line lead wire conductive member. In this case, the step of forming the pattern comprising the at least one conductive member may comprise steps of: forming a pattern comprising the at least one metal data line lead wire conductive member; and forming at least one third via, at least one fourth via and at least one fifth via penetrating through the spacer layer after the step of forming the spacer layer and before the step of forming the pattern comprising the data lines and the data line lead wires, the third via being provided on the common electrode line lead wire, the fourth via being provided on the gate line lead wire, and the fifth via being provided under the data line lead wire.

In the above method, the step of forming the pattern comprising the at least one metal common electrode line lead wire conductive member and the at least one metal gate line lead wire conductive member and the step of forming the pattern comprising the data lines and the data line lead wires are performed synchronously, the step of forming the pattern comprising the at least one metal data line lead wire conductive member and the step of forming the pattern comprising the common electrode lines, the common electrode lead wires, the gate lines and the gate line lead wires are performed synchronously.

In addition, the common electrode lines and the gate lines may be provided in the same layer and formed synchronously. The spacer layer refers to a material layer provided between the layer in which the common electrode lines and the gate lines are provided and the layer in which the data lines are provided. The spacer layer may comprise a gate insulation layer, a planarization layer, etc.

In other words, the step for forming the array substrate having such structure comprises steps of: forming the pattern comprising the common electrode lines, the common electrode line lead wires, the gate lines, the gate line lead wires and the at least one data line lead wire conductive member; forming the spacer layer; forming the at least one third via, the at least one fourth via and the at least one fifth via, the third via being provided on the common electrode line lead wire, the fourth via being provided on the gate line lead wire, and the fifth via being provided under the data line lead wire; and forming the pattern comprising the data lines, the data line lead wires, the at least one metal common electrode line lead wire conductive member and the at least one metal gate line lead wire conductive member.

The at least one metal data line lead wire conductive member and the gate lines are formed synchronously. The at least one metal gate line lead wire conductive member, the at least one metal common electrode line lead wire conductive member and the data lines are formed synchronously. Therefore, compared to the fabrication of an array substrate without the above conductive member, no additional step is required in fabricating the array substrate using the method provided by the embodiments of the present invention. That is, the method for fabricating the array substrate according to the embodiments of the present invention is simple, and has a low cost.

In the embodiments of the present invention, the spacer layer may comprise a planarization layer, a gate insulation layer, etc.

As described above, in the embodiments of the present invention, the conductive member may be made of conductive adhesive. The resistance of the conductive member may be controlled by adjusting the concentration of the conductive balls in the conductive adhesive.

It can be understood that, although the principle of the technical solutions of the present invention is illustrated by taking the display panel having a narrow border as an example in the embodiments of the present invention, the present invention may also be applied to a display panel having a non-narrow border, and technical effects of adjusting resistance of a signal line lead wire and improving uniformity of signal driving can also be achieved.

It should be appreciated that the above embodiments are only the exemplary embodiments employed for illustrating the principle of the present invention, but the present invention is not limited thereto. It will be apparent to those skilled in the art that various modifications and improvements can be made without departing from the spirit and essence of the present invention, and these modifications and improvements are also considered to fall within the protection scope of the present invention.

The invention claimed is:

1. An array substrate, comprising a first region and a second region adjoining the first region, a plurality of signal lines being provided in the first region, and a plurality of lead wires connected with the plurality of signal lines being provided in the second region, wherein
the array substrate comprises at least one conductive member, each conductive member is connected in parallel with one lead wire, and an overall resistance of the conductive member and the lead wire connected in parallel with the conductive member is smaller than a resistance of the lead wire connected in parallel with the conductive member,
transparent electrodes are provided in the first region,
each conductive member comprises a transparent conductive member made of the same material as the transparent electrode and provided in the same layer as the transparent electrode,
an insulation layer is provided between a layer comprising the transparent electrode and the transparent conductive member and a layer comprising the lead wires, and
each transparent conductive member is connected with the lead wire through at least one via penetrating through the insulation layer, so that the transparent conductive member is connected in parallel with the lead wire.

2. The array substrate of claim 1, wherein, among the plurality of lead wires, the longest lead wires having a number equal to the number of the at least one conductive member are connected in parallel with the at least one conductive member, respectively.

3. The array substrate of claim 1, wherein
the transparent electrodes comprise first transparent electrodes provided above the signal lines and second transparent electrodes provided below the signal lines,
each transparent conductive member comprises a first transparent conductive member provided above the lead wire and/or a second transparent conductive member provided below the lead wire,
the first transparent conductive member is made of the same material as the first transparent electrodes and provided in the same layer as the first transparent electrodes, and the second transparent conductive member is made of the same material as the second transparent electrodes and provided on the same layer as the second transparent electrodes, and
the via comprises a first via connecting the first transparent conductive member and the lead wire and a second via connecting the second transparent conductive member and the lead wire.

4. The array substrate of claim 3, wherein when the conductive member comprises the first transparent conductive member, the conductive member further comprises a conductive adhesive part provided on and electrically connected with the first transparent conductive member.

5. The array substrate of claim 1, wherein the signal lines comprise common electrode lines, gate lines and/or data lines.

6. The array substrate of claim 1, wherein
the signal lines comprise common electrode lines, gate lines and data lines,
the lead wires comprise common electrode line lead wires, gate line lead wires and data line lead wires,
the conductive member comprises a common electrode line lead wire conductive member, a gate line lead wire conductive member and a data line lead wire conductive member,
the common electrode line lead wire conductive member comprises a metal common electrode line lead wire conductive member connected in parallel with the common electrode line lead wire through a third via, the gate line lead wire conductive member comprises a metal gate line lead wire conductive member connected in parallel with the gate line lead wire through a fourth via, and the data line lead wire conductive member comprises a metal data line lead wire conductive member connected in parallel with the data line lead wire through a fifth via,
the metal common electrode line lead wire conductive member, the metal gate line lead wire conductive member and the data lines are made of the same material and provided in the same layer, the metal data line lead wire conductive member and the gate lines are made of the same material and provided in the same layer.

7. The array substrate of claim 1, wherein the conductive member is made of conductive adhesive.

8. A display panel, comprising the array substrate of claim 1.

9. A method for fabricating an array substrate, comprising steps of:
forming a plurality of signal lines in a first region, and forming a plurality of lead wires connected with the plurality of signal lines in a second region adjoining the first region; and
forming at least one conductive member, each conductive member being connected in parallel with one lead wire, and an overall resistance of the conductive member and the lead wire connected in parallel with the conductive member being smaller than a resistance of the lead wire connected in parallel with the conductive member,
wherein between the step of forming the signal lines and the lead wires and the step of forming the at least one conductive member, the method further comprises steps of:
forming an insulation layer; and
forming at least one first via penetrating through the insulation layer in the insulation layer, the first via being provided on the lead wire, and the conductive member being connected in parallel with the lead wire through the first via.

10. The method of claim 9, wherein the number of the conductive members is equal to that of the lead wires.

11. The method of claim 9, wherein the array substrate comprises first transparent electrodes provided above the signal lines, the conductive member comprises a first transparent conductive member, and
   the step of forming the at least one conductive member comprises steps of:
   forming a first transparent electrode material layer on the insulation layer, wherein the transparent electrode material forming the first transparent electrode material layer fills the at least one first via; and
   forming a pattern comprising the first transparent electrodes and the at least one first transparent conductive member, the first transparent conductive member being electrically connected with the lead wire through the first via.

12. The method of claim 11, wherein the step of forming the at least one conductive member further comprises a step of: providing a conductive adhesive part on each first transparent conductive member, so that the first transparent conductive member and the conductive adhesive part together constitute at least a portion of the conductive member.

13. The method of claim 9, wherein the array substrate further comprises second transparent electrodes provided below the signal lines, and
   before the step of forming the signal lines and the lead wires, the method further comprises steps of:
   forming a second transparent electrode material layer;
   forming a pattern comprising the second transparent electrodes and at least one second transparent conductive member, the at least one second transparent conductive member being provided in the second region;
   forming an insulation layer, the insulation layer covering the second transparent electrodes and the at least one second transparent conductive member; and
   forming at least one second via penetrating through the insulation layer, the second via being provided on the second transparent conductive member, and
   the method of forming the signal lines and the lead wires comprises steps of:
   forming a metal layer, wherein material forming the metal layer fills the at least one second via; and
   performing a patterning process on the metal layer to form the signal lines and the lead wires, the lead wire being electrically connected with the second transparent conductive member through the second via.

14. The method of claim 9, wherein the signal lines comprises common electrode lines, gate lines and/or data lines.

15. The method of claim 14, wherein the step of forming the signal lines and the lead wires comprises steps of:
   forming a pattern comprising the common electrode lines, common electrode line lead wires, the gate lines and gate line lead wires;
   forming a spacer layer; and
   forming a pattern comprising the data lines and data line lead wires.

16. The method of claim 15, wherein the conductive member comprises a common electrode line lead wire conductive member, a gate line lead wire conductive member and a data line lead wire conductive member, the common electrode line lead wire conductive member comprises a metal common electrode line lead wire conductive member, the gate line lead wire conductive member comprises a metal gate line lead wire conductive member, and the data line lead wire conductive member comprises a metal data line lead wire conductive member, and
   the step of forming the at least one conductive member comprises steps of:
   forming a pattern comprising the at least one metal data line lead wire conductive member; and
   forming at least one third via, at least one fourth via and at least one fifth via penetrating through the spacer layer after the step of forming the spacer layer and before the step of forming the pattern comprising the data lines and the data line lead wires, the third via being provided on the common electrode line lead wire, the fourth via being provided on the gate line lead wire, and the fifth via being provided under the data line lead wire.

17. The method of claim 16, wherein
   the step of forming the pattern comprising the at least one metal common electrode line lead wire conductive member and the at least one metal gate line lead wire conductive member and the step of forming the pattern comprising the data lines and the data line lead wires are performed synchronously,
   the step of forming the pattern comprising the at least one metal data line lead wire conductive member and the step of forming the pattern comprising the common electrode lines, the common electrode lead wires, the gate lines and the gate line lead wires are performed synchronously.

18. The method of claim 9, wherein the conductive member is made of conductive adhesive.

* * * * *